(12) United States Patent
Lee et al.

(10) Patent No.: US 9,025,344 B2
(45) Date of Patent: May 5, 2015

(54) ELECTRONIC RELAY

(75) Inventors: Jong-Min Lee, Incheon (KR); Gil-Su Kim, Siheung-si (KR); Chul-Jin Jang, Incheon (KR)

(73) Assignee: Korea Electric Terminal Co., Ltd., Incheon (KR)

( * ) Notice: Subject to any disclaimer, the term of this patent is extended or adjusted under 35 U.S.C. 154(b) by 175 days.

(21) Appl. No.: 13/817,299

(22) PCT Filed: Jun. 7, 2011

(86) PCT No.: PCT/KR2011/004160
§ 371 (c)(1),
(2), (4) Date: Feb. 15, 2013

(87) PCT Pub. No.: WO2012/023693
PCT Pub. Date: Feb. 23, 2012

(65) Prior Publication Data
US 2013/0141831 A1     Jun. 6, 2013

(30) Foreign Application Priority Data

Aug. 19, 2010  (KR) .................. 10-2010-0080541
Aug. 19, 2010  (KR) .................. 10-2010-0080542
Dec. 22, 2010  (KR) .................. 10-2010-0132152

(51) Int. Cl.
*H01H 85/20* (2006.01)
*H02B 1/18* (2006.01)
*H01H 50/02* (2006.01)
*H05K 5/00* (2006.01)

(52) U.S. Cl.
CPC ........... *H01H 50/021* (2013.01); *H05K 5/0039* (2013.01)

(58) Field of Classification Search
USPC .................. 361/752–753, 819–837
See application file for complete search history.

(56) References Cited

U.S. PATENT DOCUMENTS 5,668,698 A * 9/1997 Jozwiak et al. ............... 361/752
6,850,421 B2 * 2/2005 Boyd ............................ 361/833
2008/0285253 A1 * 11/2008 Scheiber et al. .............. 361/837

FOREIGN PATENT DOCUMENTS

| JP | 09-288952 A | 11/1997 |
| JP | 2004-063220 A | 2/2004 |
| JP | 2006-173165 A | 6/2006 |
| KR | 20-2008-0001454 U | 5/2008 |

OTHER PUBLICATIONS

International Search Report for PCT/KR2011/004160 mailed Feb. 6, 2012 from Korean Intellectual Property Office.

* cited by examiner

*Primary Examiner* — Tuan T Dinh
(74) *Attorney, Agent, or Firm* — Sherr & Jiang, PLLC

(57) ABSTRACT

An electronic relay includes: a housing having an interior space therein and a lateral side and a lower side of which are opened, a board installation part being formed along a periphery of the opened side of the housing; a printed circuit board a periphery of which is inserted into and installed in the board installation part of the housing, for shielding the opened side of the housing and performing a switching function; a lower cover for shielding a lower side of the housing, one side edge of the printed circuit board being fixed to the lower cover; and terminals ends of which are electrically connected to the printed circuit board and opposite ends of which pass through the lower cover to protrude to the outside.

13 Claims, 15 Drawing Sheets

ELECTRONIC RELAY

CROSS REFERENCE TO PRIOR APPLICATION

This application is a National Stage Patent Application of PCT International Patent Application No. PCT/KR2011/004160 (filed on Jun. 7, 2011) under 35 U.S.C. §371, which claims priority to Korean Patent Application Nos. 10-2010-0080541 (filed on Aug. 19, 2010), 10-2010-0080542 (filed on Aug. 19, 2010) and 10-2010-0132152 (filed on Dec. 22, 2010) which are all hereby incorporated by reference in their entirety.

TECHNICAL FIELD

The present invention relates to an electronic relay, and more particularly to an electronic relay which employs a printed circuit board having a function of interrupting flow of a current to be operated in an electronic manner.

BACKGROUND ART

A relay refers to a type of switch, and controls a higher voltage and a current with a low DC voltage. According to the related art, relays use a principle of an electromagnet. That is, if a coil is wound on a core and current flows through the coil, they act as an electromagnet to generate a magnetic field and a moving iron installed near the core on which the coil is wound is moved to the magnetic field to generate a switching operation. In this way, a relay operated by an electromagnet made by winding a coil on a core is referred to as a mechanical relay.

In the mechanical relay, since a coil should be wound on a core and a space for moving the moving iron and a large installation space for a spring for returning the iron are necessary, the size of the mechanical relay becomes large.

Further, operation noise is generated while the moving iron is moved, generating noise in a product employing the relay.

In addition, since the relay is large as compared with other components such as a fuse, the size of the product employing the relay becomes large. In particular, an area where the relay is positioned should be minimized to reduce the size of the product.

In order to solve the problems, many studies on electronic relays providing a printed circuit board to which components are mounted have been recently conducted.

DETAILED DESCRIPTION OF THE INVENTION

Technical Problem

Therefore, the present invention has been made in view of the above-mentioned problems, and an aspect of the present invention is to provide an electronic relay which uses a printed circuit board having a switching function.

Another aspect of the present invention is to more smoothly emit heat generated by an electronic relay using a printed circuit board having a switching function to the outside.

Another object of the present invention is to provide an electronic relay which requires a minimum installation area.

Another object of the present invention is to provide an electronic relay which can be more easily assembled.

Another object of the present invention is to provide an electronic relay whose parts are more firmly coupled and which shows excellent waterproof performance.

Another object of the present invention is to transfer a fixing resin supplied to one side of a printed circuit board installed within a housing to a periphery of an opposite surface of the printed circuit board.

Another object of the present invention is to prevent a fixing resin from leaking to an outer side of a support shelf between a printed circuit board and the support shelf in an electronic relay.

Technical Solution

In accordance with an aspect of the present invention, there is provided an electronic relay including: a housing having an interior space therein and a lateral side and a lower side of which are opened, a board installation part being formed along a periphery of the opened side of the housing; a printed circuit board a periphery of which is inserted into and installed in the board installation part of the housing, for shielding the opened side of the housing and performing a switching function; a lower cover for shielding a lower side of the housing, one side edge of the printed circuit board being fixed to the lower cover; and terminals ends of which are electrically connected to the printed circuit board and opposite ends of which pass through the lower cover to protrude to the outside.

In accordance with another aspect of the present invention, there if provided an electronic relay including: a housing having an interior space therein and one outer surface of which is opened, a board installation part being formed along a periphery of the opened side of the housing; a printed circuit board a periphery of which is inserted into and installed in the board installation part of the housing, for shielding the opened side of the housing and performing a switching function; a lower cover for shielding a lower side of the housing, one side edge of the printed circuit board being fixed to the lower cover; and terminals ends of which are electrically connected to the printed circuit board and opposite ends of which pass through the lower cover to protrude to the outside.

In accordance with still anther embodiment of the present invention, there is provided an electronic relay including: a housing having a first space opened downward, having a second space opened upward, and a support step formed along an inner surface thereof between the first space and the second space; a lower cover a portion of which is inserted into and fixed to an interior of the fist space of the housing, having an interior space opened to face the first space, and having a plurality of terminal slits passing through the lower cover to communicate the interior space with the outside; a terminal plate coupled to and located in the interior space of the lower cover and having a terminal positioning surface and a terminal slit; a printed circuit board located and fixed between the support step of the housing, and the lower cover and the terminal plate to perform a switching function; and a terminal electrically connecting the printed circuit board to the outside, located in the terminal positioning surface and the terminal slit of the terminal plate, having a board connecting part connected to the printed circuit board at one end thereof, and having a protrusion passing through the terminal slit of the lower cover at an opposite end thereof, wherein a fixing resin is injected into the first space.

In accordance with yet another embodiment of the present invention, there is provided an electronic relay including: a housing having an interior space opened upward and downward and having a support step along an inner surface of the interior space; a printed circuit board positioned on a lower surface of a support step of the housing and including a switching function; a lower cover inserted into the interior space of the housing to shield a lower portion of the housing and support the printed circuit board such that the printed circuit is positioned on the support step; a terminal plate coupled to and installed in the lower cover; and a terminal installed between the terminal plate and the lower cover, and one end of which is electrically connected to the printed circuit board and an opposite end of which passes through the lower cover to protrude to the outside, wherein a buffering space is formed between the support step and the printed circuit board such that a portion of the fixing resin filled between the lower cover and the printed circuit board is located in the buffering space.

Advantageous Effects

The electronic relay according to the present invention has the following effects.

That is, according to the electronic relay of the present invention, since a printed circuit board includes a switching function, operation noise is not generated at all, which significantly increases noise performance of a product employing the electronic relay.

According to the present invention, since one side of a housing is opened and one surface of the printed circuit board is exposed to the outside of the housing, heat can be more smoothly emitted from an interior of the housing to the outside. Thus, operation reliability of the printed circuit board in the housing can be constantly maintained.

Further, according to the present invention, since the printed circuit board is not installed in a transverse direction of the housing but is erected to form one outer surface of the housing, the electronic relay can be designed such that an area of a lower surface of the electronic relay does not depend on the printed circuit board. Thus, since an area of the lower surface of the housing is minimized, an area necessary for installing the electronic relay can be minimized.

Furthermore, according to the present invention, since the printed circuit board, the terminal plate, the terminal, and the lower cover to be installed within the housing are assembled in the housing while they form one assembly, assembling performance is excellent. In particular, since a plurality of terminals is assembled in the housing while being fixed between the terminal plate and the lower cover, the terminals can be more easily assembled.

In addition, according to the present invention, a fixing resin is injected into a space between the printed circuit board and the lower cover so that the printed circuit board, the lower cover, the terminal plate, and the terminals are coupled to each other, water cannot be penetrate into the interior of the housing and the components can be more firmly coupled.

Next, according to the present invention, a buffering space is formed in a support step in which the printed circuit board is attached and positioned within the housing so that a fixing resin injected into a space between the printed circuit board and the lower cover passes by a periphery of the printed circuit to a buffering space, preventing penetration of water toward the lower cover and penetration of water toward the support step to some degree.

In addition, according to the present invention, since the fixing resin is prevented from being injected past the support step due to the buffering space formed in the support step, a process of manufacturing the electronic relay is simplified.

MODE FOR CARRYING OUT THE INVENTION

Figure 1:
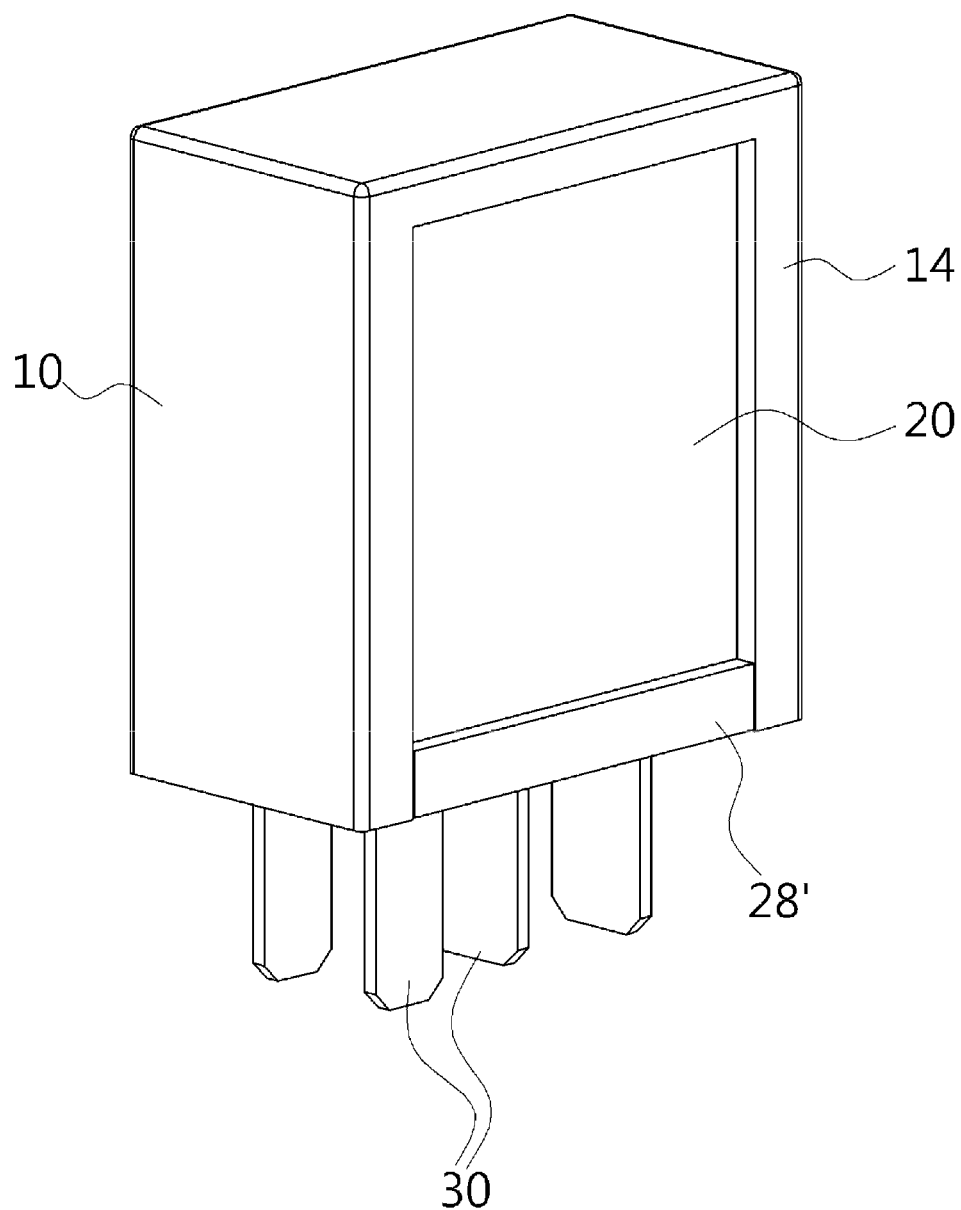
FIG. 1 is a perspective view showing an outer appearance of an electronic relay according to an embodiment of the present invention.
Figure 2:
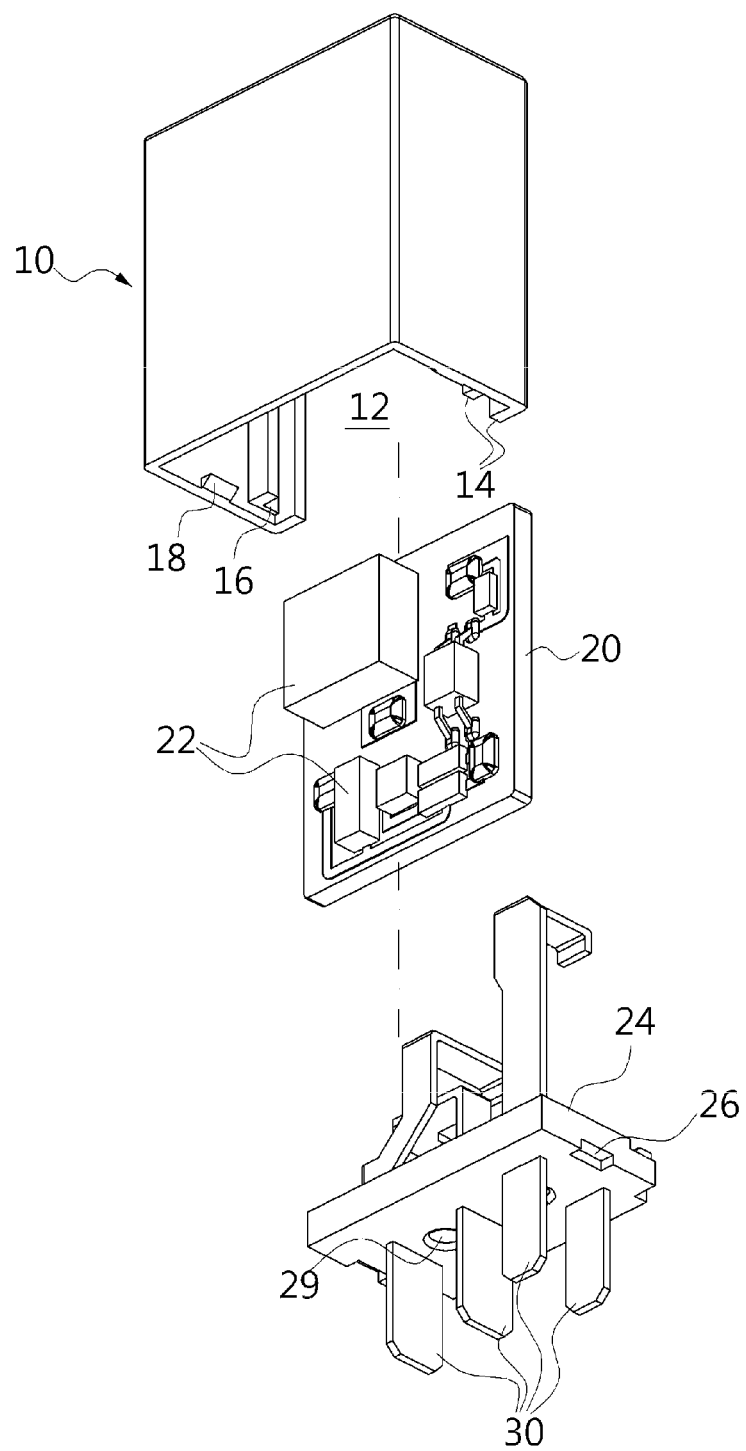
FIG. 2 is an exploded perspective view showing the electronic relay of FIG. 1.
Figure 3:
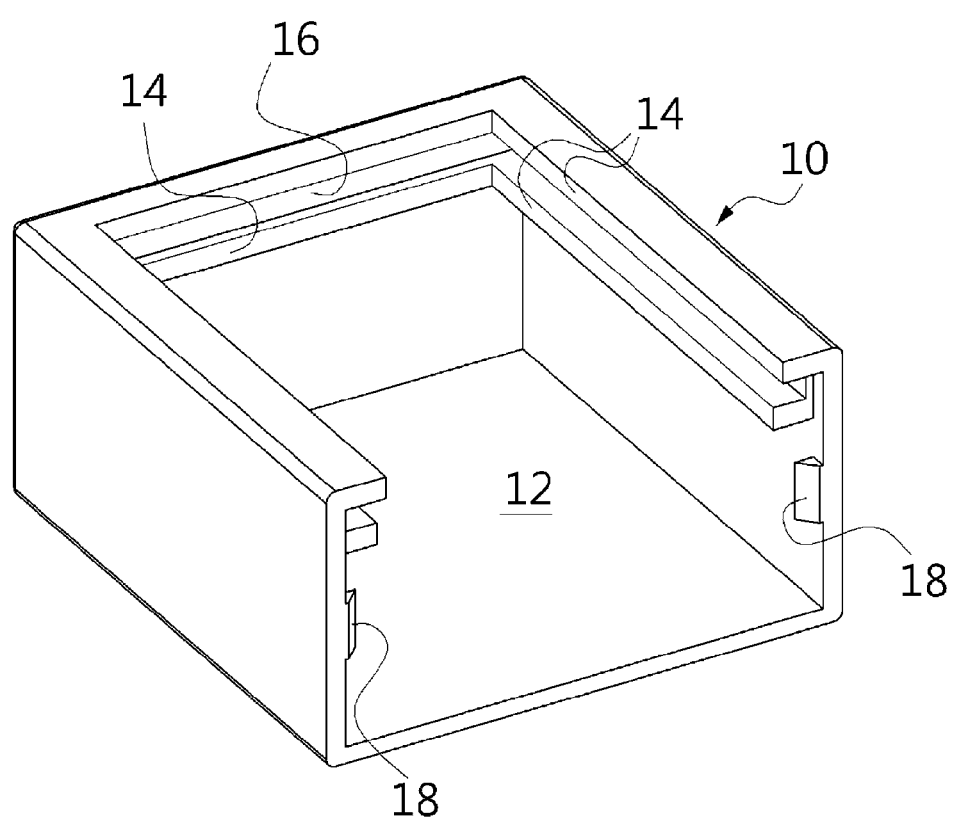
FIG. 3 is a bottom perspective view showing a housing of the electronic relay of FIG. 1.

Hereinafter, electronic relays according to exemplary embodiments of the present invention will be described in detail with reference to the accompanying drawings.

Referring to FIGS. 1 to 4, a housing 10 forms an outer appearance of an electronic relay. The housing 10 is formed of an insulating synthetic resin and corresponds to a parallelepiped shape. A lower side and one lateral side of the housing 10 are opened. In particular, a lateral side of the housing 10 which has the widest area is opened, and a printed circuit board 20 to be described below is installed at the lateral side of the housing 10. The shape of the housing 10 corresponds to a flat parallelepiped upper and lower sides of which are rectangular. Lateral sides of the four lateral sides corresponding to each other have the same rectangular shapes, and the printed circuit board 20 is installed at the widest lateral side of the four lateral sides. Of course, the area of the lateral side of the housing 10 at which the printed circuit board 20 is installed is wider than the area of the lower side of the housing 20.

An interior space 12 is formed in the housing 10. Terminals 30 to be described below and a fixing resin are located in the interior space 12. A pair of fixing partition walls 14 is formed at one side of the interior space 12. The pair of fixing partition walls 14 is formed side by side in the interior space 12 along edges of the opened lateral side of the housing 10. The distance between the fixing partition walls 14 formed side by side corresponds to a thickness of the printed circuit board 20 to be described below. The fixing partition walls 14 are formed on an inner surface of the interior space 12 along an upper end and opposite side ends of the opened lateral side of the housing 10. The inter-space formed by the fixing partition walls 14 corresponds to a board installation part 16. Edges of the printed circuit board 20 to be described below are inserted into and installed in the board installation part 16.

Stopping bosses 18 protrude from inner lower ends of the interior space 12 of the housing 10. The stopping bosses 18 are formed on inner surfaces of the lateral sides of the housing 10 having a relatively smaller area. The stopping bosses 18 are stopped by stopping recesses 26 of the lower cover 24 to be described below.

Opposite ends of the printed circuit board 20 are installed in the board installation part 16 of the housing 10. Three edges of the printed circuit board 20 are inserted into and installed in the board installation part 16. Components 22 are mounted on one surface of the printed circuit board 20. An opposite surface of the printed circuit board 20 is exposed to the outside of the housing 10. Of course, a metal plate (not shown) may be provided on the opposite surface of the printed circuit board 20 exposed to the outside of the housing 10. The metal plate emits heat generated by the printed circuit board 20 to the outside.

The printed circuit board 20 corresponds to a rectangular plate shape, and employs a switching function. That is, the switching function is implemented by a circuit pattern in the printed circuit board 20 and the components 22. Ends of the terminals 30 to be described below are soldered and mounted to the printed circuit board 20.

The lower cover 24 is mounted to a lower side of the housing 10. The lower cover 24 is mounted to a lower opened portion of the housing 10 to shield the interior space 12. Of course, the lower cover 24 also fixes one edge of the printed circuit board 20 to the terminals 30 to be described below.

The lower cover 24 is made of an insulating synthetic resin, and stopping recesses 26 are formed at opposite lower ends of the lower cover 24. The catching bosses 18 of the housing 10 are positioned in and stopped by the stopping recesses 26.

Figure 4:
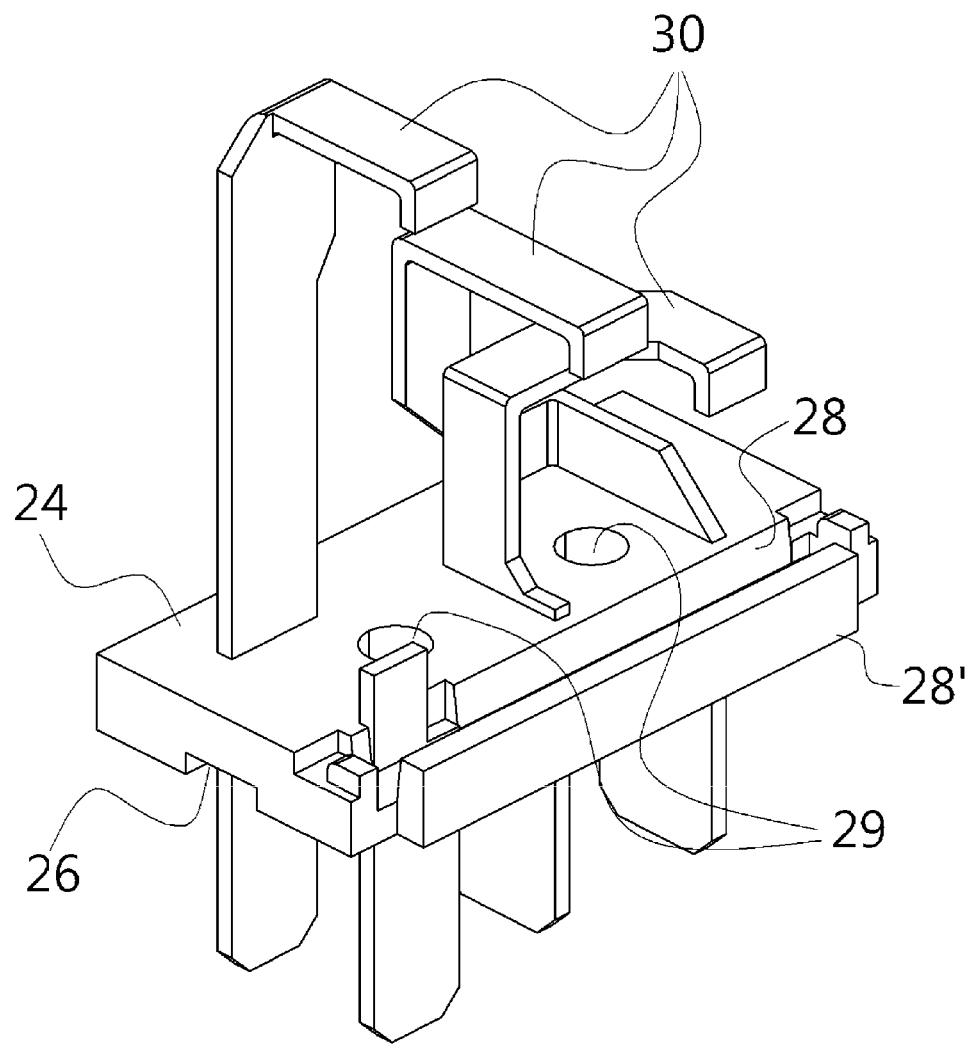
FIG. 4 is a perspective view showing a lower cover and terminals of the electronic relay of FIG. 1.

As well shown in FIG. 4, a board positioning channel 28 is formed long along a side edge of an upper surface of the lower cover 24. One edge of the printed circuit board 20 is inserted into and positioned in the board positioning channel 28. An outer partition wall 28' is formed long to partition the board positioning channel 28 from the outside. The outer partition wall 28' cooperates with the fixing partition walls 14 of the housing 10 to form an outer surface of the housing 10. In this way, due to the existence of the outer partition wall 28' and the fixing partition walls 14, the printed circuit board 20 is spaced inward from an outer surface of the housing 10 by a predetermined depth, preventing an external force from directly acting on the printed circuit board 20 to some degree.

Through-holes 29 are formed to vertically pass though the lower cover 24. The through-holes 29 are used to inject a fixing resin into the interior space 12 of the housing 10. Two through-holes 29 are formed such that the fixing resin is injected through one through-hole 29 and air in the interior space 12 is exhausted to the outside through the other through hole 29 when the fixing resin is injected. For reference, the fixing resin is preferably a thermally conductive resin. By using the thermally conductive resin, the terminals 30 to be described below can be precisely fixed to an interior of the housing 10, heat generated in the interior of the housing 10 can be more promptly emitted to the outside, and a spark can be prevented from being generated due to high voltage.

The terminals 30 are used to electrically connect the printed circuit board 20 to the outside. The terminals 30 are insert-molded to be integrally formed with the lower cover 24 when the lower cover 24 is manufactured. In the present embodiment, four terminals 30 are used. Ends of the terminals 30 are connected to the printed circuit board 20, and opposite ends of the terminals 30 pass through the lower cover 24 to protrude to the outside.

Assembling and usage of the electronic relay of FIGS. 1 to 4 having the above-described construction will be described in detail.

In the present embodiment, the printed circuit board 20, the lower cover 24, and the terminals 30 constitute one assembly, and are provided to an assembly line and are coupled to the housing 10. To this end, first, when the lower cover 24 is manufactured, the terminals 30 are integrally formed with the lower cover 24 through injection-molding. Of course, the terminals 30 may not be necessarily integrally formed with the housing 10 through insert-molding, but the housing 10 may be manufactured in advance and the terminals 30 may be press-fitted into the housing 10 to be fixed.

Next, one side edge of the printed circuit board 20 is inserted into and fixed to the board positioning channel 28 of the lower cover 24. In this state, the terminals 30 and the printed circuit board 20 are soldered to each other. The lower cover 24 may be preferably made of a material which can endure heat applied during the soldering process.

If the terminals 30 and the printed circuit board 20 are integrally assembled in and fixed to the lower cover 24 through the process, one assembly is finished. The assembly is coupled to the housing 10.

That is, the printed circuit board 20 is inserted from a lower portion of the housing 10 to be inserted into the board insertion part 16 formed between the fixing partition walls 14 of the housing 10. If the printed circuit board 20 is completely inserted into the housing 10, the lower cover 24 is also installed at a lower portion of the housing 10. In particular, the stopping bosses 18 of the housing 10 is positioned in the stopping recesses 26 of the lower cover 24, the lower cover 24 and the housing 10 are integrally coupled to each other.

Next, the fixing resin is injected into the interior space 12 through one through hole 29 formed in the lower cover 24. If a syringe is inserted through the through-hole 29 to inject the fixing resin, the fixing resin is filled in an interior of the interior space 12, and the air in the interior space 12 is exhausted through the other through-hole 29 so that the fixing resin is filled in the interior space 12. If the fixing resin is filled in the interior space 12, one surface of the printed circuit board 20 and the terminals 30 passing through the lower cover 24 are surrounded by the fixing resin and moisture and the like cannot enter the interior space 12 from the outside.

The assembled electronic relay of the present embodiment is operated while the plurality of terminals 30 is electrically connected to the outside. That is, if a switching operation is generated according to a current flow condition, the switching operation cuts off or connects flow of a current in the printed circuit board 20.

If the electronic relay is operated in this way, no components are moved in the housing 10, causing no noise at all. Thus, operation noise of a product employing the electronic relay can be eliminated or reduced.

In particular, in the electronic relay of the present embodiment, one outer side of the housing 10, that is, a lateral side of the housing 10 having a relatively wide area is opened, and the printed circuit board 20 is installed at the lateral side of the housing 10. One surface of the printed circuit board 20 is completely exposed to the outside of the housing 10, making it possible to more certainly emit heat to the outside.

Further, in the present embodiment, a side of the housing 10 at which the printed circuit board 20 is installed has the widest area, and the lower side, the upper side, and the other outer sides of the housing 10 may have relatively small areas. In particular, since the lower side of the housing 10 is not influenced by the area of the printed circuit board 20, an area in which the electronic relay is installed can be minimized.

Figure 5:
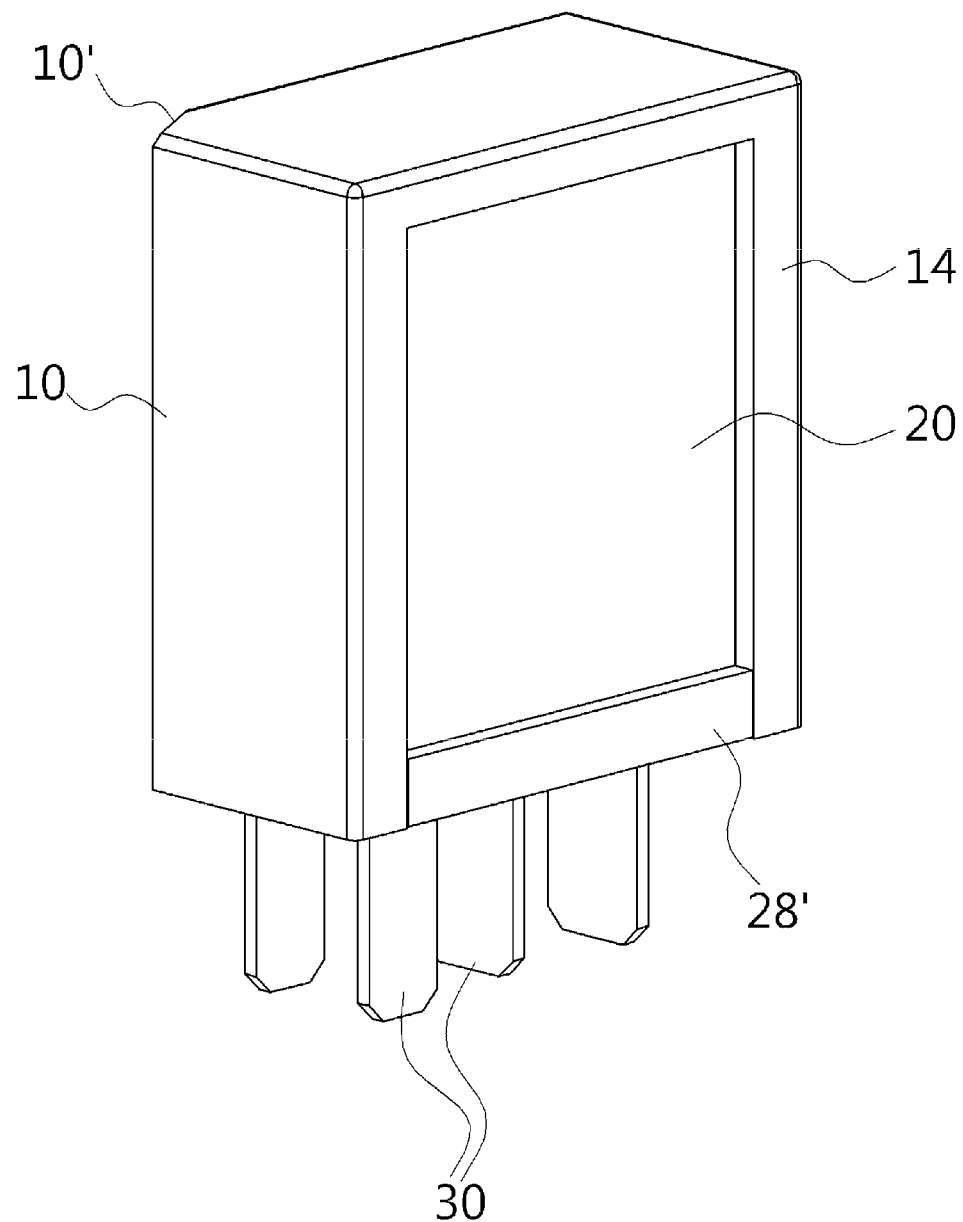
FIG. 5 is a perspective view showing a modified example of the electronic relay of FIG. 1.
Figure 6:
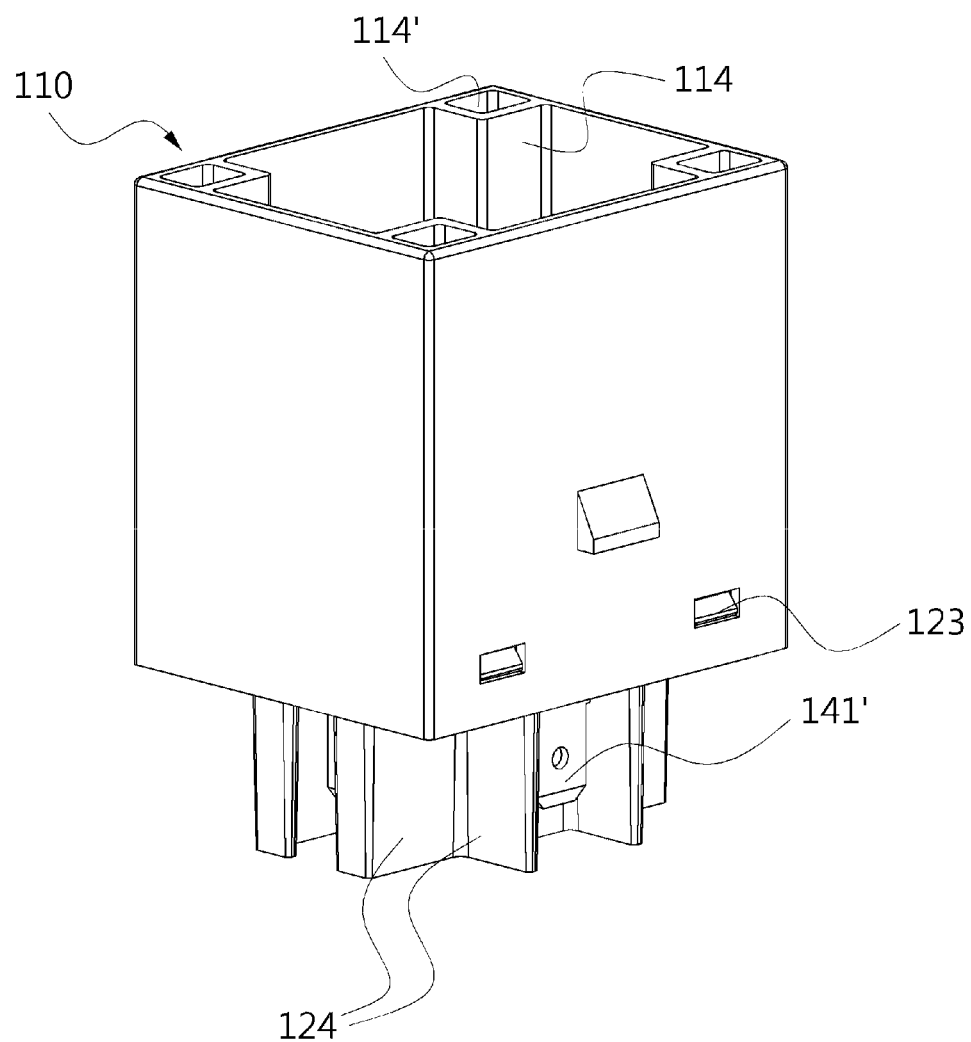
FIG. 6 is a perspective view showing an outer appearance of an electronic relay according to another embodiment of the present invention.
Figure 7:
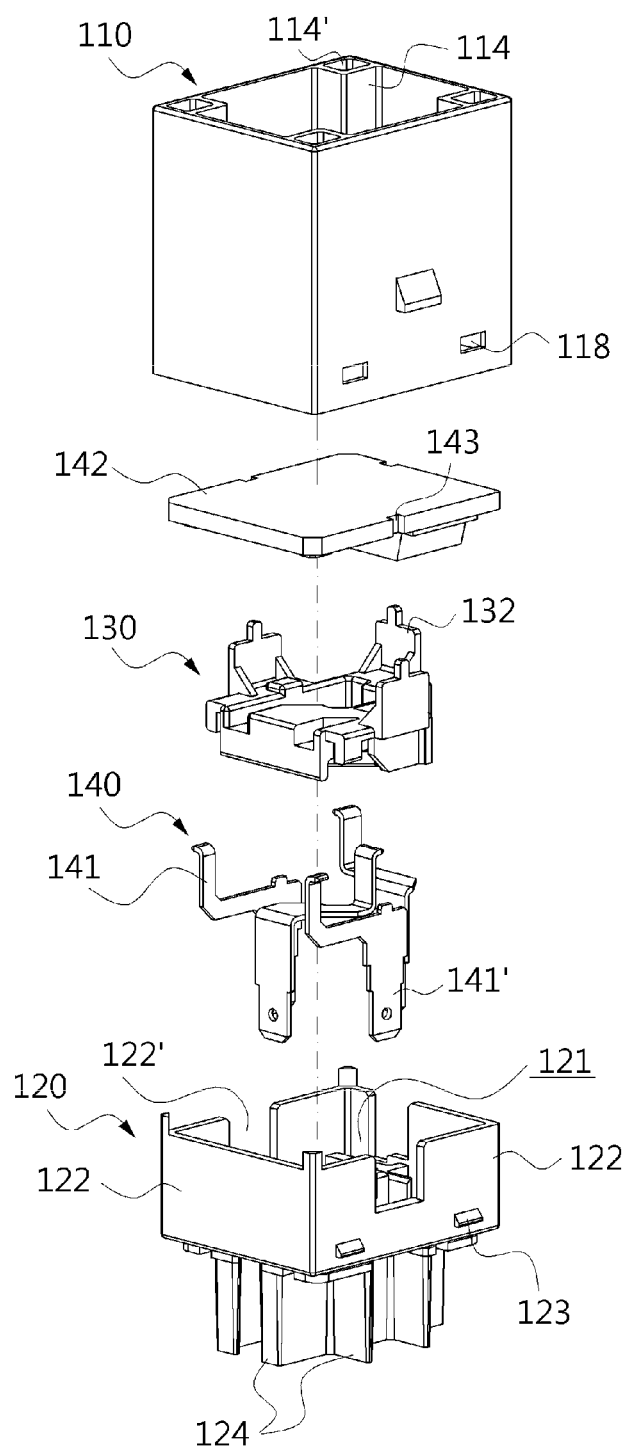
FIG. 7 is an exploded perspective view showing the electronic relay of FIG. 6.
Figure 8:
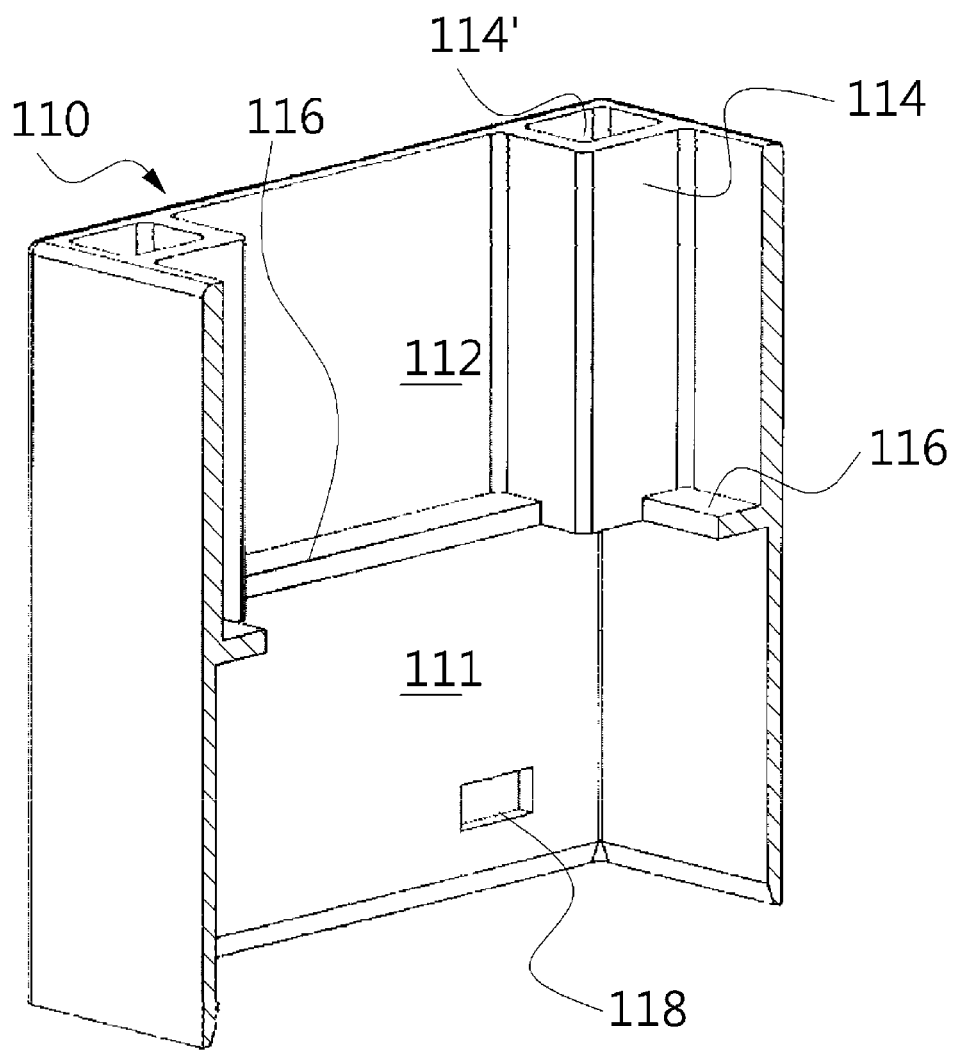
FIG. 8 is a sectional perspective view showing a housing of the electronic relay of FIG. 6.
Figure 9:
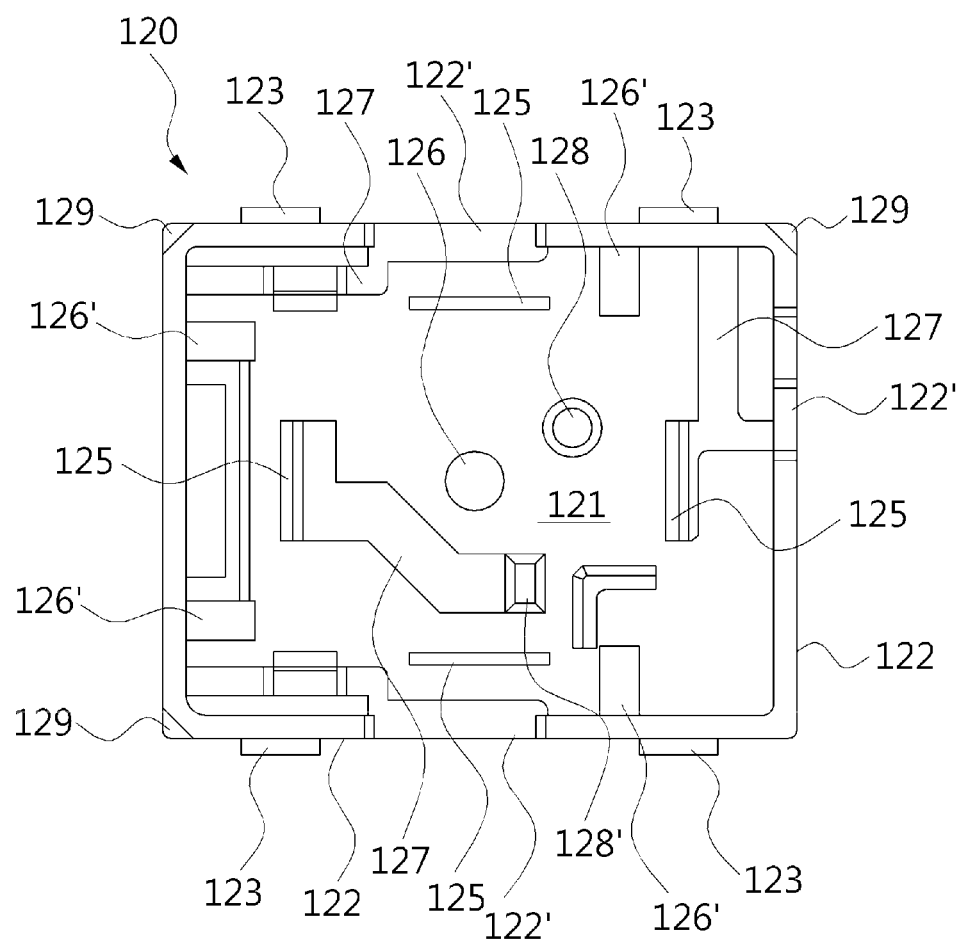
FIG. 9 is a plan view showing an interior of a lower cover of the electronic relay of FIG. 6.
Figure 10:
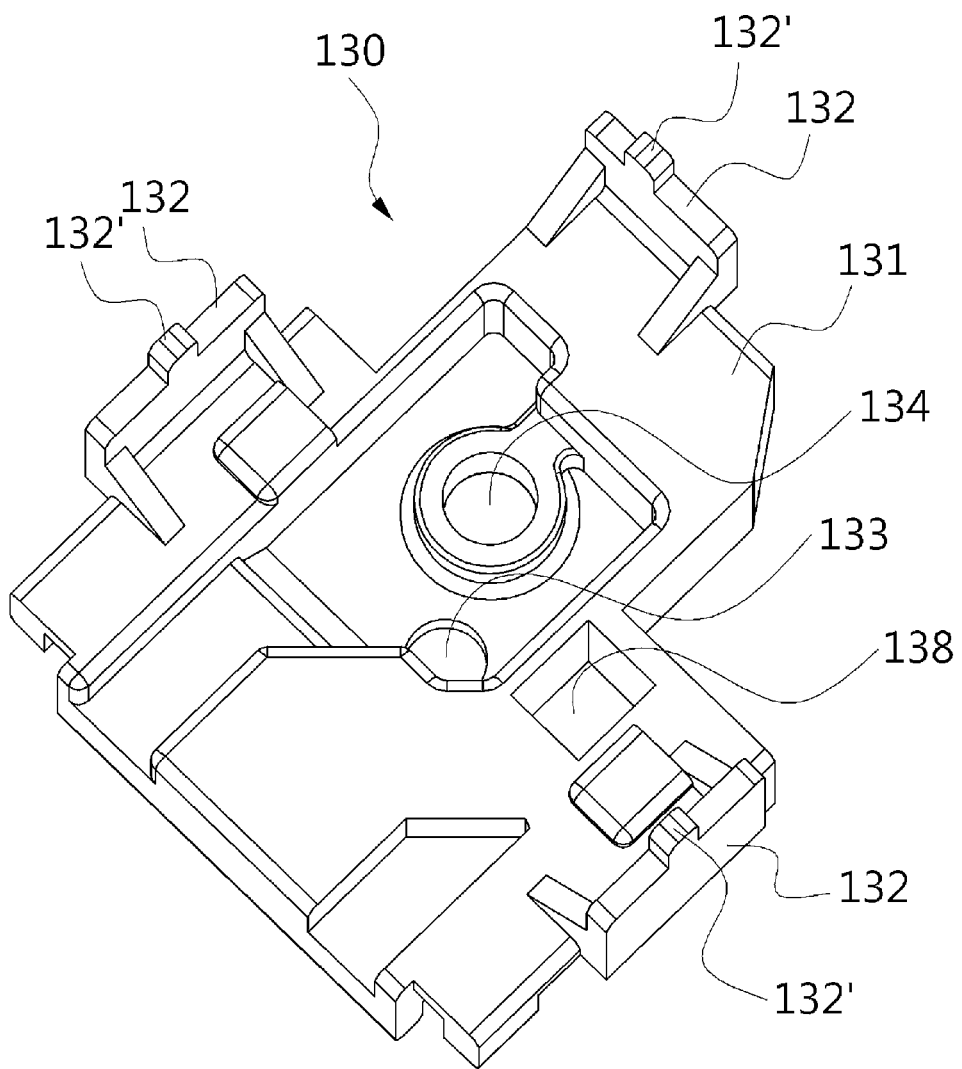
FIG. 10 is an upper perspective view showing a terminal plate of the electronic relay of FIG. 6.
Figure 11:
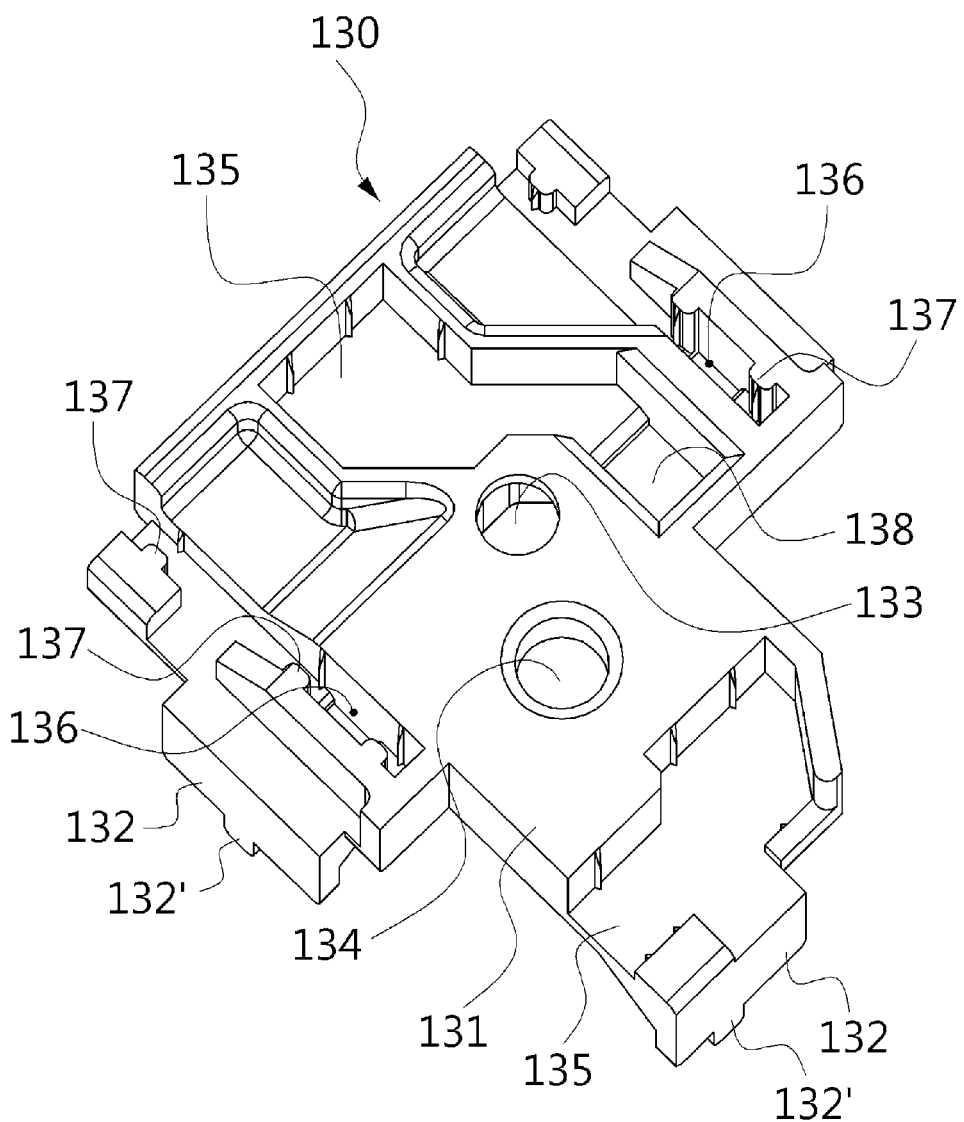
FIG. 11 is a lower perspective view showing a terminal plate of the electronic relay of FIG. 6.
Figure 12:
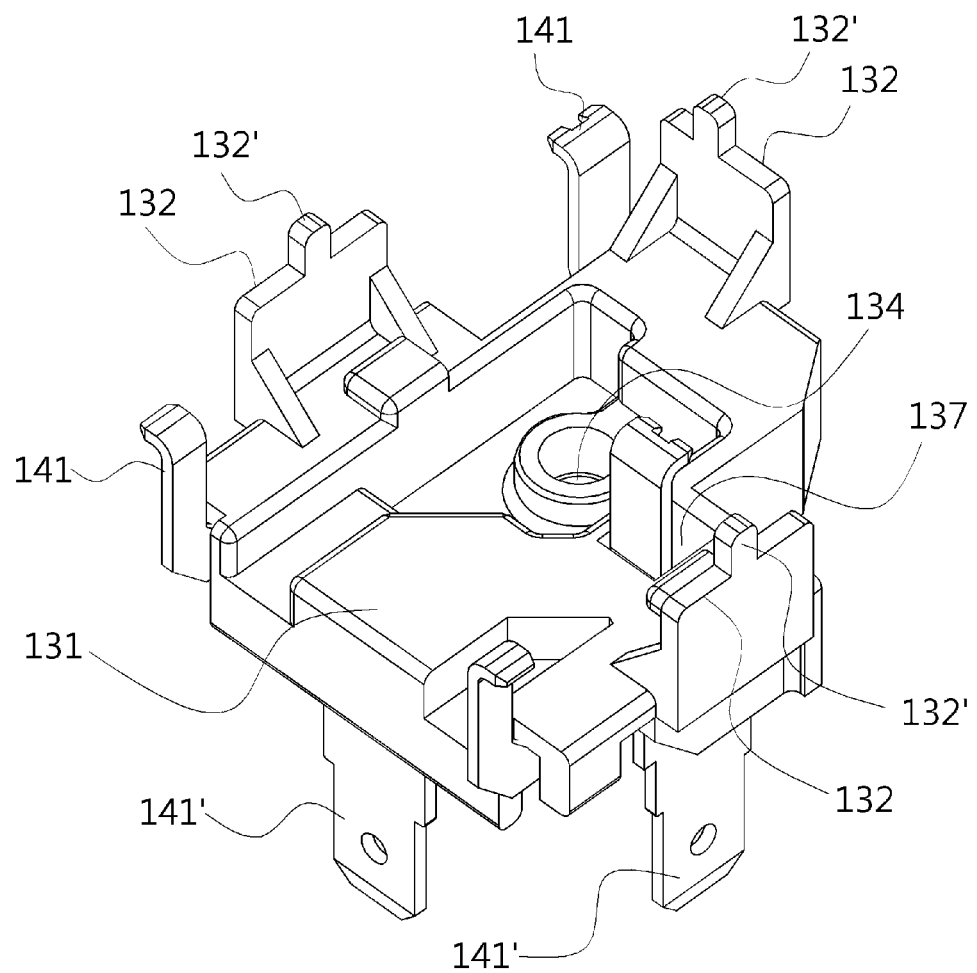
FIG. 12 is a perspective view showing a plurality of terminals mounted to the terminal plate of the electronic relay of FIG. 6.

For reference, the housing 10 constituting the electronic relay of FIG. 1 may not necessarily have a parallelepiped shape. For example, as shown in FIG. 5, a chamfered surface 10' may be formed along at least one corner of the parallelepiped to form the housing 10. Further, a portion of the housing 10 may have various shapes such as a spherical shape.

Next, an electronic relay according to another embodiment of the present invention will be described with reference to the accompanying drawings. Referring to the drawings, a housing 110 forms an outer appearance of the electronic relay of the present invention. The housing 110 is formed of an insulating synthetic resin and corresponds to a parallelepiped shape. Of course, the housing 110 may not necessarily have a parallelepiped shape but may have various polyhedral shapes. For example, a portion of the housing 110 may be spherical. Upper and lower sides of the parallelepiped housing 110 are opened. A first space 111 and a second space 112 are formed in the housing 110 to be communicated with each other. The first space 111 is a space formed at a relatively lower portion of the housing 110 where various components to be described below are located. The second space 112 is a space formed at a relatively upper portion of the housing 110 which remains empty when the electronic relay is assembled.

Reinforcing columns 114 are formed at four corners of an interior of the housing 110 corresponding to the second space 112. The reinforcing columns 114 maintain strength of the housing 110 at a predetermined level or higher. A cross-section of each reinforcing column 114 is rectangular, and a cavity 114' is formed in the reinforcing column 114. That is, the reinforcing column 114 corresponds to an empty rectangular column shape.

The first space 111 and the second space 112 are not completely partitioned from each other. The first space 111 and the second space 112 are partitioned such that they are communicated with each other by support steps 116 formed on an inner surface of the housing 110. The support steps 116 are formed along fourth inner surfaces of the housing 110 to connect positions corresponding to lower ends of the reinforcing columns 114 formed in the first space 111. The support steps 116 protrude from an inner surface of the housing 110 by a predetermined width. The support steps 116 may neither necessarily have the same width nor are formed continuously.

Stopping holes 118 are formed at a lower end of the housing 110. In the present embodiment, two stopping holes 118 are formed on opposite side walls of the housing 110 facing each other, respectively. The stopping holes 118 pass through the housing 110 so that the second space 112 is communicated with the outside. However, the stopping holes 118 may be recessed on an inner surface of the housing 110.

Next, a construction of a lower cover 120 will be described. A portion of the lower cover 120 is inserted into and positioned in a first space in a lower portion of the housing 110. The lower cover 120 shields a lower portion of the housing 110. An interior space 121 is formed in an interior of the lower cover 120. The interior space 120 is opened toward the first space 111 of the housing 110. The interior space 121 of the lower cover 120 is a substantially parallelepiped space. A side wall 122 forms an upper outer side of the lower cover 120. The side wall 122 forms an inner side of the interior space 121.

Coupling cutaway portions 122' are formed in the side wall 122. The coupling cutaway portions 122' are formed in a total of three side walls 122. Coupling pieces 132 of terminal plates 130 to be described below are located in the coupling cutaway portions 122'. The coupling cutaway portions 122' have a rectangular shape, and are opened toward tip ends of the side walls 122.

Stopping steps 123 are formed on outer surfaces of the side walls 122. The stopping steps 123 are stopped by the stopping holes 118 of the housing 110. The stopping steps 123 protrude from locations of the outer surfaces of the side walls 122 corresponding to the stopping holes 118.

A guide partition wall 124 is formed on a lower surface of the lower cover 120. A planar shape of the guide partition wall 124 corresponds to a substantially #-like shape. Terminals 140 to be described below are located in spaces defined by the guide partition wall 124. A central space of the spaces formed by the guide partition wall 124 is shielded except for a lower side thereof, and each of the remaining spaces is opened at one side thereof. The terminals 140 protrude in the spaces defined by the guide partition wall 124. A total of five spaces are partitioned by the guide partition wall 124, in which case an injection hole 126 to be described below is formed in the central space and terminal slots 125 are formed in the four spaces surrounding the central space having the injection hole 126, respectively. The guide partition wall 124 protrudes by a length the same as or longer than a length of a protrusion 141' of the terminal 140 to be described below.

An injection hole 126 passes through a center of a bottom plate of the lower cover 120. The injection hole 126 is used to inject a fixing resin into a first interior space 111 of the housing 110. When the fixing resin is injected through the injection hole 126, air in the first interior space 111 is exhausted to the outside through an air exhaust hole 126'. The air exhaust holes 126' are formed in the bottom plate of the lower cover 120. In the present embodiment, the air exhaust holes 126' are formed at locations adjacent to four corners of the lower cover 120. For reference, the injection hole 126 is preferably formed at or near a center of the bottom plate of the lower cover 120. That is so as air is transferred to the air exhaust holes 126' at the periphery of the lower cover 120 by the fixing resin injected through the injection hole 126 at the center of the lower cover 120, the interior air can be easily exhausted.

A plurality of support ribs 127 is formed on an upper surface of the bottom plate of the lower cover 120. The support ribs 127 support the terminal plates 140 to be described below. The support ribs 127 are formed at locations adjacent to the side walls 122 of the lower cover 120 or close to the center of the bottom plate of the lower cover 120.

A first guide boss 128 is formed on a surface of the bottom plate of the lower cover 120, and a second guide boss 128' protrudes from an upper end of the support rib 127 adjacent to the injection hole 126. The guide bosses 128 and 128' guide coupling of the lower cover 120 to the terminal plate 130 to be described below.

Guide ribs 129 are formed at upper end corners of the side walls 122 of the lower cover 120. The guide ribs 129 guide corners of a printed circuit board 142 to be described below. The guide ribs 129 are formed only at three corners. However, they also may be formed at four corners.

The terminal plate 130 cooperates with the lower cover 120 so that terminals 140 to be described below may be fixed to and installed in the terminal plate. The terminal plate 130 is also used to preliminarily fix the terminals 140 to solder the terminals 140 and the printed circuit board 142 to each other. The terminal plate 130 should be made of a heat-resistant material to endure heat generated when the printed circuit board 142 and the terminals 140 are soldered to each other.

A body plate 131 forms a body of the terminal plate 130. The body plate 131 is formed to have various convexo-concave shapes on upper and lower surfaces thereof. Coupling pieces 132 positioned in cutaway portions 122' of the lower cover 120 are formed at the periphery of the body plate 131. Thus, a total of three coupling pieces are formed. Each of the coupling pieces 132 has a rectangular plate shape to be positioned in the coupling cutaway portion 122'. In order to allow the coupling pieces 132 to be positioned in the coupling cutaway portions 122' of the lower cover 120, the coupling pieces 132 protrude from side surfaces of the body plate 131 by a thickness corresponding to a thickness of the side walls 122 on which the coupling cutaway portions 122' are formed. Thus, the body plate 131 is introduced into the side walls 122 of the lower cover 120, and the coupling pieces 132 are positioned in the coupling cutaway portions 122'.

A guide boss 132' protrudes from a tip end of each of the coupling pieces 132. The guide boss 132' is coupled to a guide recess 143 of the printed circuit board 142 to be described below so that the printed circuit board 142 may be preliminarily assembled in the terminal plate 130.

An injection hole 133 is formed at a central portion of the body plate 131 at a location corresponding to the injection hole 126 of the lower cover 120. The injection hole 133 is used to inject the fixing resin. A guide through-hole 134 is formed at one side of the body plate 131 corresponding to a vicinity of the injection hole 133. A first guide boss 128 of the lower cover 120 is inserted into the guide through-hole 134. As the first guide boss 128 is inserted into the guide through-hole 134, the coupling of the terminal plate 130 to the lower cover 120 is accurately guided.

Terminal positioning surfaces 135 are formed at portions of the body plate 131 facing the lower cover 120. Intermediate portions of the terminals 140 to be described below are positioned on the terminal positioning surfaces 135. Surfaces of two terminals 140 of the terminals 140 are positioned on the terminal positioning surfaces 135, respectively.

Terminal slots 136 are formed at portions of the body plate 131 facing the lower cover 120. The terminal slots 136 extend side by side along opposite ends of the body plate 131 and are formed to be slightly wider than a thickness of the terminals 140. Terminal bosses 137 are formed on an inner surface of the terminal slots 136. A plurality of terminal bosses 137 is formed in the terminal slot 136. An interval between surfaces of the terminal slots 136 facing tip ends of the terminal bosses 137 is substantially the same as a thickness of the terminals 140. In this way, by forming the terminal bosses 137, the terminals 140 can be easily inserted into the terminal slots 136 and the terminals 140 are prevented from accidentally being withdrawn from the terminal slots 136.

A terminal through-hole 138 passes through one side of the body plate 131. One of the terminals 140 passes through the terminal through-hole 138. Of course, a second guide boss 128' together with the terminal 140 is located in the terminal through-hole 138. In this way, the terminal through-hole 138 together with the second guide boss 128' guides the coupling of the terminal plate 130 to the lower cover 120.

Four terminals 140 are used in the present embodiment. A board connecting part 141 is formed in each of the terminals 140, and a protrusion 141' passing through the lower cover 120 and protruding to the outside is formed at an opposite side of the board connecting part 141. A portion between the board connecting part 141 and the protrusion 141' is installed in the terminal plate 130, and is not linear but bent or cut in various forms.

The board connecting part 141 of the terminal 140 is connected to the printed circuit board 142. That is, as the board connecting part 141 is soldered to the printed circuit board 142, the printed circuit board 142 and the terminal 140 are electrically connected to each other. The printed circuit board 142 has a planar shape, and employs a switching function. That is, the switching function is performed by a circuit pattern of the printed circuit board 142 itself and components mounted thereto.

A periphery of one surface of the printed circuit board 142 is positioned on a support step 116 of the housing 110, and an opposite periphery thereof is positioned on a coupling piece 132 of the terminal plate 130 and an upper end of a side wall 122 of the lower cover 120. Accordingly, the peripheries of the printed circuit board 142 are positioned and installed on the support step 116 of the housing 110 and between the terminal plate 130 and the lower cover 120.

A guide groove 143 in which a guide boss 132' formed in the coupling piece 132 of the terminal plate 130 is formed at a periphery of the printed circuit board 142. As the guide boss 132' is inserted into the guide groove 143, the printed circuit board 142 is preliminarily assembled in the terminal plate 130.

Hereinafter, assembling and usage of the electronic relay of the present invention having the above-described construction will be described in detail.

In the present embodiment, the lower cover 120, the terminal plate 130, the terminals 140, and the printed circuit board 142 constitute one assembly, and are coupled to a lower space 111 of the housing 10. To this end, the terminals 140 are located in the terminal plate 130. An intermediate portion of each of the terminals 140 is located in the terminal portioning surface 135 and the terminal slot 136 of the terminal plate 130. Then, the terminal 140 positioned in the terminal slot 136 is press-fitted and fixed to the terminal slot 136 by the guide boss 132'. The terminals 140 are installed in the body plate 131 such that all the board connecting parts 141 thereof face the same side. One of the terminals 140 passes through the terminal through-hole 138 of the body plate 131, and is positioned in the terminal positioning part 135.

If the terminals 140 are preliminarily assembled in the body plate 131 of the terminal plate 130, the printed circuit board 142 is coupled to the body plate 131. Then, the guide boss 132' formed at a tip end of the coupling piece 132 of the body plate 131 is inserted into the guide groove 143 of the printed circuit board 142. The board connecting parts 141 of the terminals 140 is located at locations corresponding to a location where the circuit pattern formed in the printed circuit board 142 is exposed, or are inserted into through-holes formed in the printed circuit board 142. The board connecting parts 141 of the terminals 140 are electrically connected to the printed circuit board 142 through soldering.

Next, the lower cover 120 is coupled to the terminal plate 130. The protrusion 141' of the terminal 140 installed in the terminal plate 130 to pass through the terminal slot 125 formed in the lower cover 120 is located in a space defined by the guide partition wall 124 of the lower cover 120.

The terminal plates 130 are coupled to the lower cover 120 by inserting the coupling pieces 132 of the terminal plates 130 into the cutaway portions 122' of the lower cover 120, locating the first guide bosses 128 of the lower cover 120 in the guide through-holes 134 of the terminal plates 130, and inserting the second guide bosses 128' into the terminal through-holes 138 of the terminal plate 130.

If an assembly of the lower cover 120, the terminal plates 130, the terminals 140, and the printed circuit board 142 is finished, it is inserted into the first space 111 of the housing 110. Portions of the lower cover 120 except for the guide partition walls 124 are inserted into the first space 111.

If the lower cover 120 is inserted into the first space 111 such that the stopping steps 123 formed on an outer surface of the lower cover 120 is stopped by the stopping holes 118 of the housing 110, the electronic relay is assembled while the lower cover 120 is coupled to the housing 110.

Then, the printed circuit board 142 is supported by the support step 116 of the housing 110 so as not to enter the second space 112. That is, a periphery of one surface of the printed circuit board 142 is supported by the support step 116 and the assembly including the lower cover 120 is coupled to the housing 110 by stopping the stopping step 123 of the lower cover 120 with the stopping hole 118.

Next, the fixing resin is injected into the first space 111 through the injection hole 126 formed in the lower cover 120. If a syringe is inserted through the injection hole 126 to inject the fixing resin, the fixing resin is filled in the first space 111, in which case the air in the first space 111 is exhausted through the air exhaust hole 126' and the fixing resin is filled in the first space 111. If the fixing resin is filled in the first space 111, all components located between one surface of the printed circuit board 142 and a bottom plate of the lower cover 120 are surrounded by the fixing resin and moisture and the like cannot enter the first space 111 from the outside.

The electronic relay assembled in this way is operated while the plurality of terminals 140 is electrically connected to the outside. That is, if a switching operation is generated according to a current flow condition, the switching operation cuts off or connects flow of a current in the printed circuit board 141.

Further, the printed circuit board 142 is located in the first space 111 such that almost all portions of one surface of the printed circuit board 142 are exposed to the second space 112, so that heat generated during an operation of the printed circuit board 142 may be more smoothly emitted to the outside through the second space 112. In particular, if a heat dissipating member is a surface of the printed circuit board 142 exposed to the second space 112, a heat dissipating operation can be more smoothly performed.

Meanwhile, the housing 110 is formed such that the second space 112 is opened to the upper side. Thus, strength of an upper end of the housing 110 can become relatively weak, in which case the reinforcing columns 114 are formed at corners of the second space 112 of the housing 110 to increase strength of a portion of the housing 110 corresponding to the second space 112.

Figure 13:
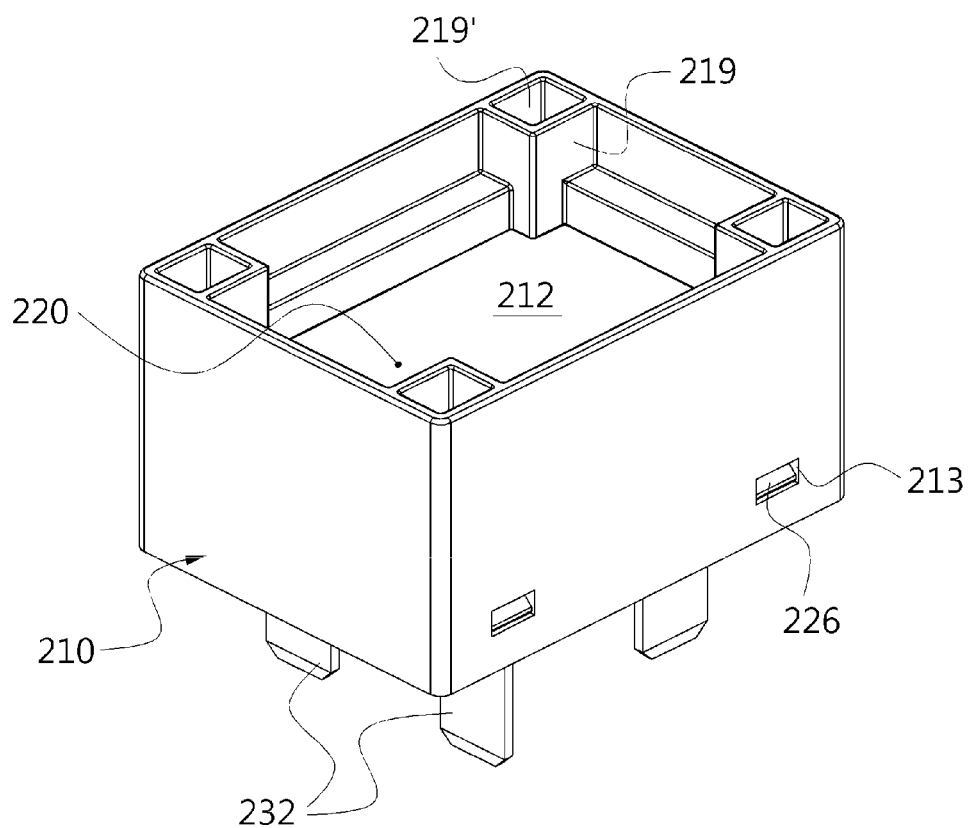
FIG. 13 is a perspective view showing an electronic relay according to another embodiment of the present invention.

Next, an electronic relay according to another embodiment of the present invention will be described with reference to FIGS. 13 to 15. Referring to the drawings, a housing 210 forms an appearance and body of the electronic relay of the present embodiment. The housing 210 is made of an insulating synthetic resin. An interior space 212 formed in the housing to have a substantially parallelepiped shape is opened at upper and lower sides of the housing 210. Here, the housing 210 may not necessarily have a parallelepiped shape, and may have various shapes as described above. Stopping holes 214 are formed at lower portions of the housing 120. Stopping steps 226 of a lower cover 220 to be described below are stopped by the stopping holes 214. In the present embodiment, two stopping holes 213 are formed on opposite surfaces of the interior space 212 of the housing 210, respectively. Although the stopping holes 212 pass through the housing 210 in the present embodiment, they may be formed to be recessed on an inner surface of the housing 210.

A printed circuit board 220, a lower cover 222, terminal plates 228, and terminals 232 to be described below are installed in the interior space 212 of the housing 210. In particular, a space in which they are installed is a lower portion of a support step 214 formed on an inner surface of the interior space 212 of the housing 210. The support step 214 protrudes by a predetermined width along an inner surface of the housing 210. A periphery of an upper surface of the printed circuit board 220 to be described below is positioned on a lower surface of the support step 214.

Figure 14:
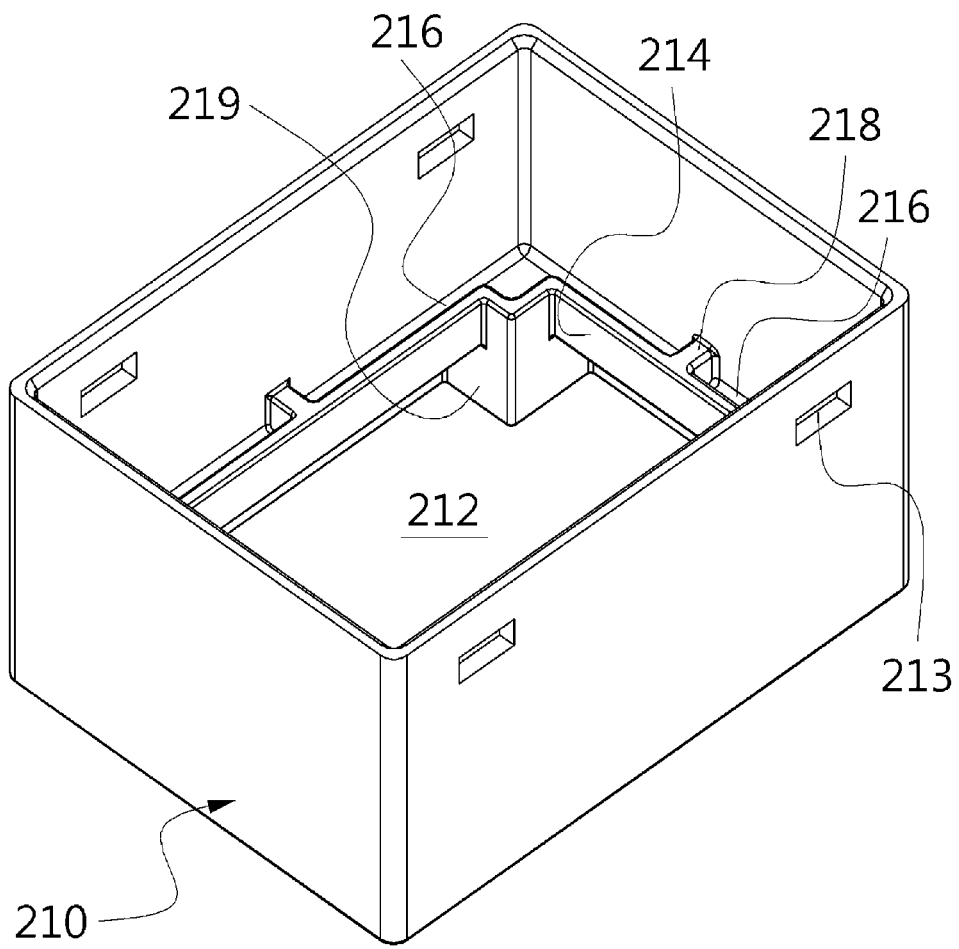
FIG. 14 is a perspective view showing a housing of the electronic relay of FIG. 13.
Figure 15:
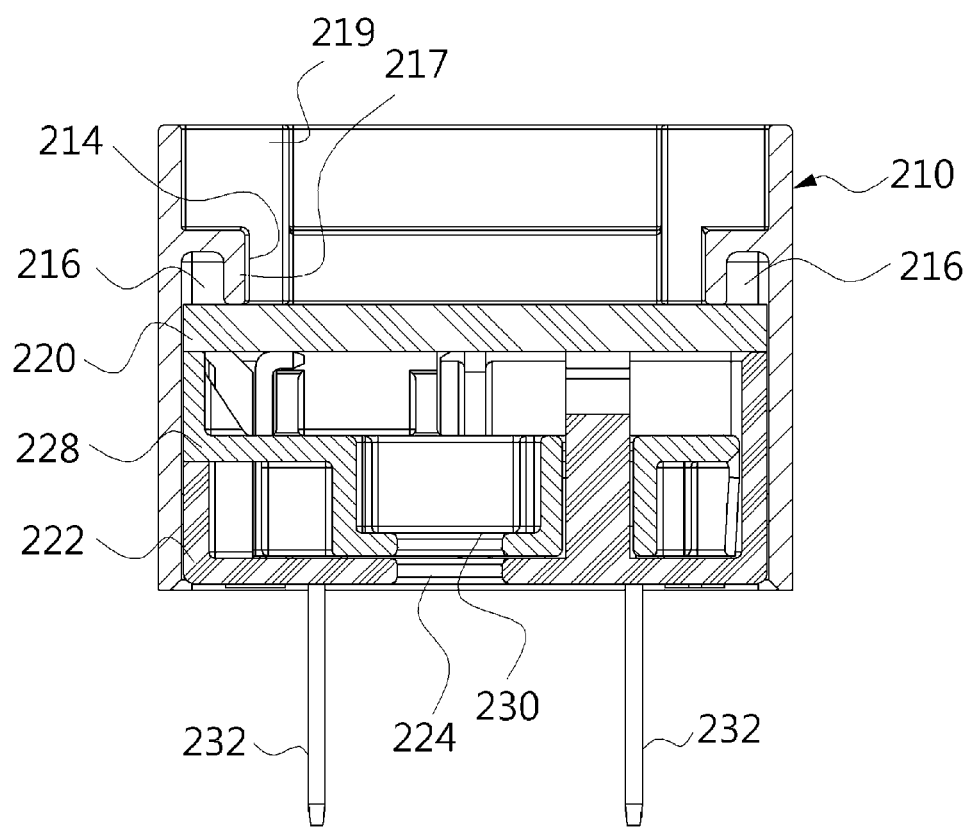
FIG. 15 is a sectional view showing a main part of the electronic relay of FIG. 13.

As well shown in FIGS. 14 and 15, a buffering space 216 opened toward a lower portion of the housing 210 is provided in the support step 214. The buffering space 216 is formed along an inner surface of the housing 210. The buffering space 216 is a space in which a fixing resin to be described below can be located. The buffering space 216 is formed by recessing an inner surface portion of the housing 210 in the support step 214, that is, by protruding a support wall 217 toward a lower side of the housing 210 along a tip end of the support step 214. A tip end of the support wall 217 supports the printed circuit board 220 to be described below.

As well shown in FIG. 14, a reinforcing rib 218 is provided to connect the support wall 217 and an inner surface of the housing 210. The reinforcing rib 218 is provided in the buffering space 216 to prevent the support wall 217 from being bent toward the inner surface of the housing 210.

Reinforcing columns 219 are formed at an upper end of the interior space 212 of the housing 210. The reinforcing columns 219 vertically extend along four corners of the interior space 212 of the housing 210. The reinforcing columns 219 cooperate with the housing 210 and have a rectangular column shape whose cross-section is rectangular. A cavity 219' is formed in each of the reinforcing columns 219 to minimize an amount of material forming the housing 210.

The printed circuit board 220 has a circuit pattern therein and various components are mounted thereto such that a switching function is performed by the circuit pattern and components to implement a function of the electronic relay. An upper surface of the printed circuit board 220 is positioned on the support step 214, in more detail, a tip end of the support wall 217, and a lower surface thereof is supported by the lower cover 222 and the terminal plates 228 to be described below.

The lower cover 222 shields a lower portion of the housing 210. Thus, an interior space (no reference numeral given) opened upward and facing the interior space 212 of the housing 210 is formed in the lower cover 222, and an overall shape thereof corresponds to a parallelepiped shape and has a size by which the interior space of the lower cover 222 can enter the interior space 212 of the housing 210. Almost all portions of the lower cover 222 are inserted into a lower portion of the support step 214 of the interior space 212 of the housing 210. A detailed construction of the lower cover 210 is not the essence of the present invention, and a detailed description thereof will be omitted. An injection hole 224 is formed in the lower cover 222, in which case a fixing resin is injected into a space formed between the printed circuit board 220 and the lower cover 222 through the injection hole 224.

A stopping step 226 protrudes at a location of an outer surface of the lower cover 222 corresponding to the stopping hole 213 of the housing 210. If the lower cover 222 is inserted into the housing 210 to a location corresponding to the stopping hole 213, the stopping step 226 is stopped by the stopping hole 213 so that the lower cover 222 is fixed within the housing 210.

The terminal plates 228 are installed in the interior space of the lower cover 222. While the terminals 232 to be described below are preliminarily assembled before the terminal plates 228 are coupled to the lower cover 222, the terminal plates 228 electrically connect the terminals 232 and the printed circuit board 220. That is, when the terminals 232 are soldered to the printed circuit board 220, plurality of terminals 232 precisely maintain relative positions thereof and remain preliminarily assembled in the printed circuit board 220. The terminal plates 228 may be preferably made of a heat-resistant material to endure a high temperature during the soldering process. The terminal plates 228 have a plate shape having various convexo-concaves on opposite surfaces thereof, and a structure for preliminarily assembling the terminals 232 and a structure for preliminarily assembling the printed circuit board 220 are formed in the terminal plate 228.

An injection hole 230 is formed in the terminal plate 228 at a location corresponding to the injection hole 224 of the lower cover 222. The fixing resin is transferred to the printed circuit board 220 through the injection hole 230.

The terminal 232 is made of a conductive metal. The terminal 232 has various shapes, in which case one end thereof passes through the lower cover 222 to protrude to the outside and an intermediate portion thereof is located between the terminal plate 228 and the lower cover 222 while being positioned on the terminal plate 228. An opposite end of the terminal 232 is soldered to the printed circuit board 220 to be electrically connected to the printed circuit board 220.

Hereinafter, assembling and usage of the electronic relay according to the present embodiment will be described in detail.

First, the assembling of the electronic relay of the present invention will be described. The printed circuit board 220, the lower cover 222, the terminal plates 228, and the terminals 232 installed within the housing 210 are assembled as one assembly before being assembled in the housing 210.

To this end, first, the terminals 232 are preliminarily assembled in the terminal plates 228. The terminals 232 are preliminarily assembled by using the structures formed in the terminal plates 228. Accordingly, relative positions between the terminals 232 can be precisely maintained.

Next, the printed circuit board 220 is preliminarily assembled in the terminal plates 228. For example, a recess (not shown) is formed in the printed circuit board 220, and a boss is formed in the terminal plate 228 to be press-fitted into the recess. If the printed circuit board 220 is installed in the terminal plates 228, ends of the terminals 232 are inserted into the through-holes of the printed circuit board 220 or contact a pad. In this state, a soldering process is performed.

If the terminals 232 and the printed circuit board 220 are completely soldered to each other, the terminal plates 228 are assembled in the lower cover 222. The terminals 232 pass through the lower cover 222 to combine the terminal plates 228 and the lower cover 222. In this state, the printed circuit board 220, the lower cover 222, the terminal plates 228, and the terminals 232 constitute one assembly.

Next, the assembly is inserted into and coupled to the interior space 212 of the housing 210. That is, the assembly is inserted into the interior space 212 through a lower portion of the housing 210. Then, the stopping step 226 of the lower cover 222 is stopped by the stopping hole 213 of the housing 210. The assembly including the lower cover 222 is coupled to the housing 210 as the stopping step 226 is coupled to the coupling hole 213.

Then, an upper surface of the printed circuit board 220 is attached to a tip end of the support wall 217 of the support step 214. That is because the printed circuit board 220 is pushed toward the support wall 217 by the lower cover 222 and the terminal plates 228.

When the assembly including the lower cover 22 is completely assembled within the housing 210, the fixing resin is injected into a space between the lower cover 222 and the printed circuit board 220 through the injection holes 224 and 230. After a lapse of a predetermined time from the injection of the fixing resin, the fixing resin is cured to be fixed in the interior space 212. As the fixing resin is filled and cured, water cannot be introduced into the space 212 between the printed circuit board 220 and the lower cover 222 from the outside.

Meanwhile, when the fixing resin is injected, it may pass through a gap between the printed circuit board 220 and the housing 210. The fixing resin having passed between an inner surface of the housing 210 and the printed circuit board 220 is located in the buffering space 216. Since the buffering space 216 has a predetermined volume, a relatively large amount of fixing resin can be filled in the buffering space 216. Of course, the fixing resin may not be filled in the entire buffering resin. That is because a surface of the printed circuit board 220 viewed from an upper side of the housing 210 may not be covered by the fixing resin as all components are mounted to a surface of the printed circuit board 220 facing the terminal plates 210.

However, if the fixing resin is filled and cured in the buffering space 216, water cannot be transferred to an opposite surface of the printed circuit board 220 by the buffering space 216 and the filled fixing resin even when water penetrates into a gap between the support step 214 and the printed circuit board 220.

The electronic relay finished in this way performs an operation thereof while the terminals 232 are coupled to and installed in a terminal and electric power is supplied to a vehicle box.

The scope of the present invention is not limited to the embodiments but defined by the claims, and it is apparent that those skilled in the art to which the present invention pertains can variously modify and change the embodiments without departing from the spirit of the present invention.

For example, the terminals 30 may not be injection-molded in the lower cover 24. Of course, if the terminals 30 are integrally formed with the lower cover 24 through injection-molding, assembling efficiency can be improved, but the present invention is not limited thereto.

The fixing resin may not be filled in the interior space 12. That is because there may be no need to consider an environment of the electronic relay where moisture is present.

Further, a lateral side of the housing 10 at which the printed circuit board 20 is installed may not have the widest area. However, considering heat emission and the installation area of the printed circuit board 20, a lateral side where the printed circuit board 20 is preferably widest and upper and lower sides and other lateral sides have rectangular shapes which are long in one direction.

Further, the housing 10 may not be parallelepiped, but a part of the housing 20 where the printed circuit board 20 is installed may be planar and the remaining parts may have various shapes.

In the shown embodiment, the stopping bosses 118 are formed in the housing 110 and the positioning recesses 126 are formed in the lower cover 124, but the stopping bosses 118 and the positioning recesses 126 may be formed at opposite locations.

Further, the reinforcing columns 114 formed in the second space 112 of the housing 110 may not be necessary. If the size of the housing 110 is relatively small so that strength can be maintained even when the second space 112 is opened upward, the reinforcing columns 114 may not be formed.

Further, although the lower cover 120 and the terminal plates 130 support the printed circuit board 142, they may be supported only by the lower cover 120.

The lower cover 120 and the guide partition walls 122 insulate the terminals 140, but may not be necessary as long as the terminals 140 are sufficiently spaced.

Further, although the lower cover 222 and the terminal plates 228 support the printed circuit board 220, they may be supported only by the lower cover 222.

The injection hole 224 of the lower cover 222 is formed near a center of the lower surface of the lower cover 222, in which case a plurality of air exhaust holes (not shown) may be formed along a periphery of the lower cover 222. When the fixing resin is injected through the injection hole 224, air between the printed circuit board 220 and the lower cover 222 is exhausted through the air exhaust hole. Due to the air exhaust hole, an amount of fixing resin transferred to the buffering space 216 can be minimized.

The invention claimed is:

1. An electronic relay comprising:
a housing having a first space opened downward, having a second space opened upward, and a support step formed along an inner surface thereof between the first space and the second space;
a lower cover having a portion which is inserted into and fixed to an interior of the first space of the housing, having an interior space opened to face the first space, and having a plurality of terminal slits passing through the lower cover to communicate the interior space with the outside;
a terminal plate coupled to and located in the interior space of the lower cover and having a terminal positioning surface and a terminal slit;
a printed circuit board located and fixed between the support step of the housing, and the lower cover and the terminal plate to perform a switching function; and
a terminal electrically connecting the printed circuit board to the outside, located in the terminal positioning surface and the terminal slit of the terminal plate, having a board connecting part connected to the printed circuit board at one end thereof, and having a protrusion passing through the terminal slit of the lower cover at an opposite end thereof,
wherein a fixing resin is injected into the first space.

2. The electronic relay of claim 1, wherein reinforcing columns each having a cavity therein are formed at four corners of the second space of the housing.

3. The electronic relay of claim 2, wherein the interior space of the lower cover is formed by a side wall such that a cutaway portion is formed at a tip end of the side wall, a coupling piece is formed on a side surface of the terminal plate corresponding to a body plate to be inserted into and fixed to the cutaway portion.

4. The electronic relay of claim 3, wherein a stopping step is formed at a corner of a tip end of a side wall of the lower cover to guide a periphery of the printed circuit board, and a guide boss is formed at a tip end of the coupling piece to be inserted into a guide groove formed in the printed circuit board.

5. The electronic relay of claim 4, wherein a guide partition wall is formed at a lower portion of the lower cover to insulate protrusions of the terminal.

6. The electronic relay of claim 5, wherein a terminal slot formed in the terminal plate having a width larger than a thickness of the terminal and a terminal support boss protrudes from one inner surface of the terminal slot such that a distance between a tip end of the terminal support boss and an opposite inner surface of the terminal slot is the same as a thickness of the terminal.

7. The electronic relay of claim 1, wherein a heat dissipating member is further installed on a surface of the printed circuit board facing the second space to emit heat generated by the printed circuit board to the outside through a second space.

8. An electronic relay comprising:
a housing having an interior space opened upward and downward and having a support step along an inner surface of the interior space;
a printed circuit board positioned on a lower surface of a support step of the housing and including a switching function;
a lower cover inserted into the interior space of the housing to shield a lower portion of the housing and support the printed circuit board such that the printed circuit is positioned on the support step;
a terminal plate coupled to and installed in the lower cover; and
a terminal installed between the terminal plate and the lower cover, and one end of which is electrically connected to the printed circuit board and an opposite end of which passes through the lower cover to protrude to the outside,
wherein a buffering space is formed between the support step and the printed circuit board such that a portion of the fixing resin filled between the lower cover and the printed circuit board is located in the buffering space.

9. The electronic relay of claim 8, wherein the buffering space is formed between a support wall extending to a lower side of the housing and an inner surface of the housing along a tip end of the support step and is formed along an inner surface of the housing.

10. The electronic relay of claim 9, wherein a reinforcing rib connecting the support wall and an inner surface of the housing is further formed in the buffering space.

11. The electronic relay of claim 8, wherein the terminal plate is located in an interior space of the lower cover to support the printed circuit board together with the lower cover.

12. The electronic relay of claim 11, wherein injection holes are formed at corresponding positions of the lower cover and the terminal plate so that the fixing resin is injected into a space between the lower cover and the printed circuit board.

13. The electronic relay of claim 12, wherein the injection hole formed in the lower cover is formed near a center of a lower surface of the lower cover and a plurality of air exhaust holes is formed along a periphery of the lower cover.

* * * * *